(12) United States Patent
Kwon et al.

(10) Patent No.: US 6,551,887 B2
(45) Date of Patent: Apr. 22, 2003

(54) METHOD OF FORMING A SPACER

(75) Inventors: Hyung-Shin Kwon, Seoul (KR);
Joon-Yong Joo, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/198,266

(22) Filed: Jul. 16, 2002

(65) Prior Publication Data

US 2003/0045061 A1 Mar. 6, 2003

(30) Foreign Application Priority Data

Aug. 31, 2001 (KR) .................................... 2001-0053353

(51) Int. Cl.[7] ............................................ H01L 21/336
(52) U.S. Cl. ....................................... 438/305; 438/595
(58) Field of Search ................................. 438/303, 305, 438/307, 529, 595

(56) References Cited

U.S. PATENT DOCUMENTS 5,015,598 A * 5/1991 Verhaar ...................... 438/305
5,153,145 A * 10/1992 Lee et al. .................... 438/305
6,440,875 B1 * 8/2002 Chan et al. .................. 438/595
6,489,206 B2 * 12/2002 Chen et al. .................. 438/305

* cited by examiner

Primary Examiner—Chandra Chaudhari
(74) Attorney, Agent, or Firm—Marger Johnson & McCollom, P.C.

(57) ABSTRACT

The present invention provides a method of forming a semiconductor device spacer. In the method, a gate pattern is formed on a semiconductor substrate, and a first insulation layer, a second insulation layer, and a third insulation layer are sequentially formed over substantially the entire surface of the resultant structure. The second and third insulation layers are formed of the same material under a first pressure and a second pressure higher than the first pressure, respectively, and preferably of silicon nitride, using a low pressure chemical vapor deposition (LPCVD) technique. The third and second insulation layers are sequentially, anisotropically etched until the first insulation layer is exposed, thereby forming a spacer and a second insulation pattern. The spacer is selectively removed by an isotropic etching method, to minimize the recessed extent of the second insulation pattern. The exposed first insulation layer is etched to form a first insulation pattern.

17 Claims, 5 Drawing Sheets

Fig. 1

(Prior Art)

Fig. 2

(Prior Art)

Fig. 3

(Prior Art)

METHOD OF FORMING A SPACER

RELATED APPLICATION

This application relies for priority upon Korean Patent Application No. 2001-53353, filed on Aug. 31, 2001, the contents of which are herein incorporated by this reference in their entirety.

FIELD OF THE INVENTION

The present invention relates to methods of fabricating semiconductor devices, and more particularly to a method of forming a spacer.

BACKGROUND OF THE INVENTION

Generally, a semiconductor device may include a gate pattern formed on a semiconductor substrate and source/drain regions formed on the semiconductor substrate laterally from the gate pattern. As semiconductor devices become highly integrated, the size of the gate pattern is reduced and the space between the gate patterns becomes narrow. As the size of the gate pattern is reduced, the source region becomes closer to the drain region to produce an undesirable short-channel effect. In order to minimize the short-channel effect, a method of forming spacers at the sidewalls of the gate pattern has been conventionally employed. But, the spacers make the space between the gate patterns narrower and result in difficult processes for forming an interlayer dielectric layer filling the space between the gate patterns. In order to solve this problem, a technology of forming an L-shaped spacer has been provided.

Figure 1:
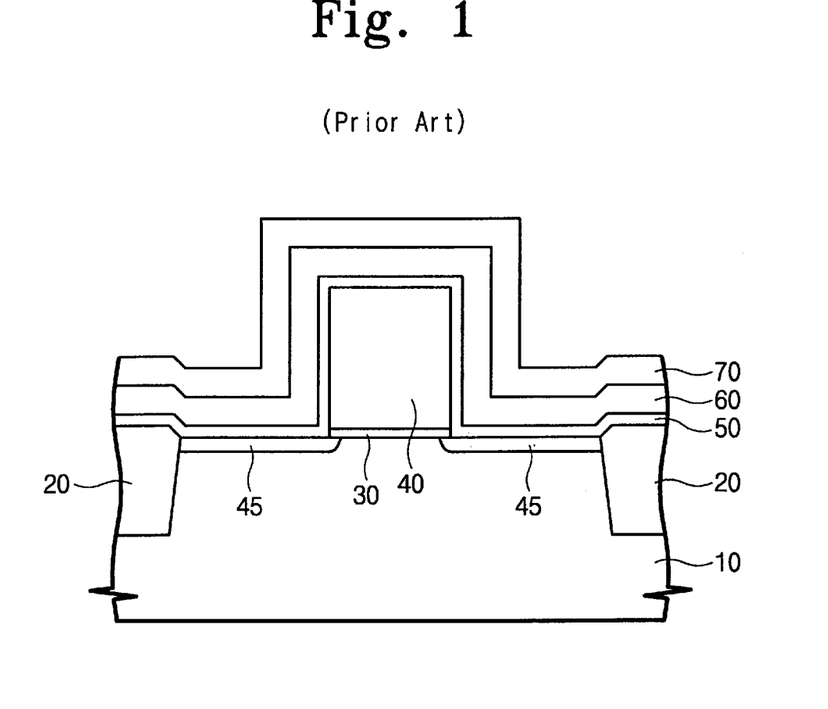
FIGS. 1 through 3 are cross-sectional views illustrating a method of forming a spacer according to a conventional technology.
Figure 2:
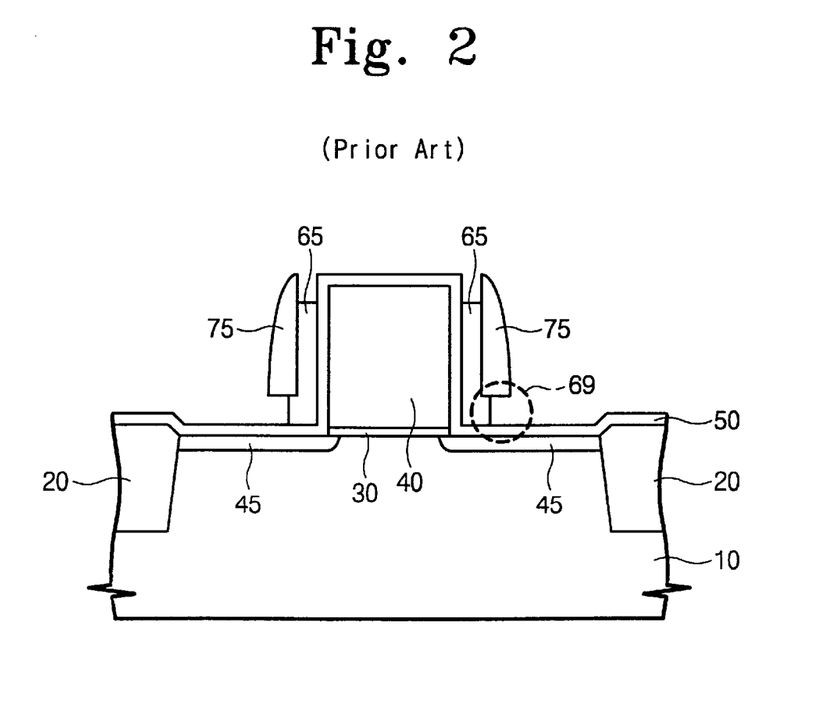
Figure 3:
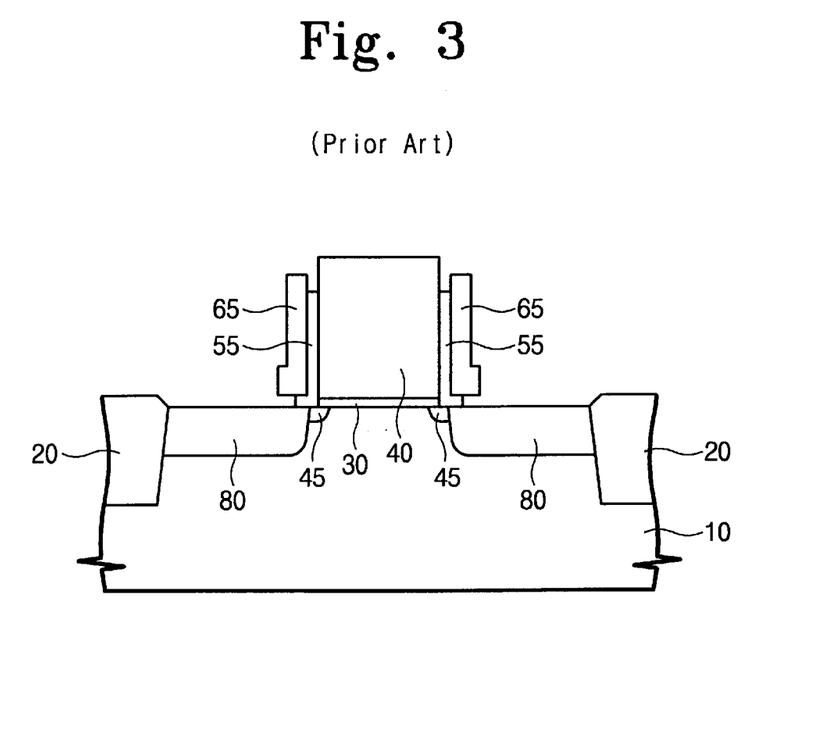

FIGS. 1 through 3 are cross-sectional views illustrating a method of forming an L-shaped spacer according to a conventional technology, and problems caused thereby.

Referring to FIG. 1, an isolation layer pattern 20 is formed at a predetermined region of a semiconductor substrate 10 to define an active region. A gate oxide pattern 30 and a gate conductive pattern 40 are sequentially stacked over the entire surface of the semiconductor substrate. An ion-implantation process is performed by using the gate conductive pattern 40 as an ion-implantation mask to form a low concentration impurity region 45 at the semiconductor substrate 10. A first insulation layer 50, a second insulation layer 60 and a third insulation layer 70 are sequentially stacked over substantially the entire surface of the semiconductor substrate 10 including the low concentration impurity region 45. The first insulation layer 50 is used as a buffer layer preventing a crystalline defect of a semiconductor substrate and an ion channeling phenomenon during an ion-implantation process for forming subsequent source/drain regions.

Conventionally, the first, second and third insulation layers 50, 60 and 70 are formed of a silicon oxide layer, a silicon nitride layer, and a silicon oxide layer, respectively. The insulation layers 50, 60, and 70 form a spacer through a subsequent etching process, so that the thickness of the insulation layers determines the distance between the source region and the drain region. Thus, when the insulation layers are thick, an area of the active region for a contact becomes narrow, and if thin, the short-channel effect is induced.

Referring to FIG. 2, the third insulation layer 70 is anisotropically etched until the second insulation layer 60 is exposed to form a spacer 75 on the sidewalls of the gate conductive pattern 40. The second insulation layer 60 acts as an etch stopping layer in the etching process. Then, the exposed second insulation layer 60 is etched by using the spacer 75 as an etch mask, until the first insulation layer 50 is exposed, and thus, a second insulation pattern 65 is formed.

The etching process for forming the second insulation pattern 65 is preferably an isotropic etching process. This is because it is difficult to determine an end of point in the anisotropical etching process, when a material layer to be etched is thin. The endpoint is a variable for determining the time when the etching process should be stopped. The endpoint is determined by using the fact that the compositions of exhaust gases are different in an etching process, when a material layer to be etched and another material layer thereunder are chemically different from one another. The second insulation layer 60 conventionally has a thickness of about 300 Å, but this thickness is too thin to determine the endpoint exactly. The thickness of the second insulation layer 60 is a variable affecting a subsequent process as explained in FIG. 1, thereby having a limit that cannot be freely increased. Thus, the etching process is preferably performed not by an anisotropical etching method but by an isotropic etching method.

When the second insulation layer 60 is etched by an isotropic etching method, as illustrated, the exposed surface of the second insulation pattern 65 is recessed. As a result, an undercut region 69 is formed at the bottom of the spacer 75 and the second insulation pattern 65 has a lower top surface than the spacer 75.

When the second insulation layer 60 remains at the side of the spacer 75, the remnant second insulation layer 60 acts as an etch stopping layer in a subsequent process of etching the first insulation layer 50, and this results in a contact inferiority of a subsequent contact interconnection. Thus, the etching process of the second insulation layer 60 is preferably performed by an over-etch method until the first insulation layer 50 is properly exposed.

To summarize, the etching process of the second insulation layer 60 should be performed by an over-etch method using an isotropic etching method. But, this etching method etches a horizontally protruded part of the second insulation pattern 65 excessively, and thus, this results in a short-channel effect after source/drain regions are subsequently formed.

Referring to FIG. 3, an etching process is performed to remove the spacer 75. In this process, the first insulation layer 50 formed of a silicon oxide layer like the spacer 75 is together etched to form a first insulation pattern 55. This results in exposing the top surfaces of the isolation pattern 20, the semiconductor substrate adjacent to the first insulation pattern 55, and the gate conductive pattern 40.

Impurities of high concentration are implanted by using the second insulation pattern 65, the first insulation pattern 55 and the gate conductive pattern 40 as ion-implantation masks, to form source/drain regions 80 in the semiconductor substrate 10. But, since the first insulation layer 50 on the source/drain regions 80 has been removed, an ion channeling phenomenon and a crystalline defect of a semiconductor substrate may occur during the implantation process. These problems happen because the first and third insulation layers 50 and 70 have no etch selectivity with respect to each other. Therefore, these problems occur even if the second insulation layer 60 is etched anisotropically.

SUMMARY OF THE INVENTION

It is an object of the present invention to provide a method of forming a spacer capable of preventing a short-channel effect by minimizing over-etching of a horizontally protruded part of a second insulation pattern.

It is another object of the present invention to provide a method of forming a spacer, where a buffer layer covers a semiconductor substrate in a process of forming source/drain regions in order to minimize ion channeling and crystalline defects.

The present invention is directed to a method of forming a spacer. The method uses material layers having different etch rates but having the same chemical composition. A gate pattern is formed on a semiconductor substrate. First, second, and third insulation layers are sequentially formed over substantially the entire surface of the resultant structure. The second and third insulation layers are formed under a first pressure and a second pressure higher than the first pressure, respectively. The third and second insulation layers are sequentially anisotropically etched to form a spacer and a second insulation pattern. The spacer is removed by using an etch recipe having an etch selectivity with respect to the second insulation pattern, thereby exposing the second insulation pattern. Next, the first insulation layer is etched to form a first insulation pattern.

Preferably, before forming the gate pattern, an isolation pattern is formed at a predetermined region of the semiconductor substrate to define an active region. After forming the gate pattern, a low concentration impurity region is preferably formed on the semiconductor substrate laterally from the gate pattern. Also, after removing the spacer, source/drain regions are preferably formed on the semiconductor substrate laterally from the gate pattern.

The first, second and third insulation layers are preferably conformally formed. The first insulation layer is formed of a silicon oxide layer, and the second and third insulation layers are preferably formed of the same material. Especially, the second and third insulation layers are preferably formed of a silicon nitride layer at a temperature of about 500 to 700° C., by using a low-pressure chemical vapor deposition (LPCVD) technique. Also, the first pressure is preferably 0.01 to 1 Torr, and the second pressure is preferably 3 to 100 Torr.

The third and second insulation layers are preferably sequentially and anisotropically etched by using an etch recipe having an etch selectivity with respect to the first insulation layer. Also, the spacer is preferably removed by using an isotropic etching method, with the etch recipe having an etch selectivity with respect to the first insulation layer. The etch recipe for removing the spacer preferably uses an etchant including a phosphoric acid.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the attached figures, the thickness of layers and regions is exaggerated for clarity. Also, when it is mentioned that a layer is on another layer or on a substrate, the layer may be directly formed on another layer or on a substrate, or a third layer may be interposed therebetween. The same reference numbers indicate the same components throughout the specification.

Figure 4:
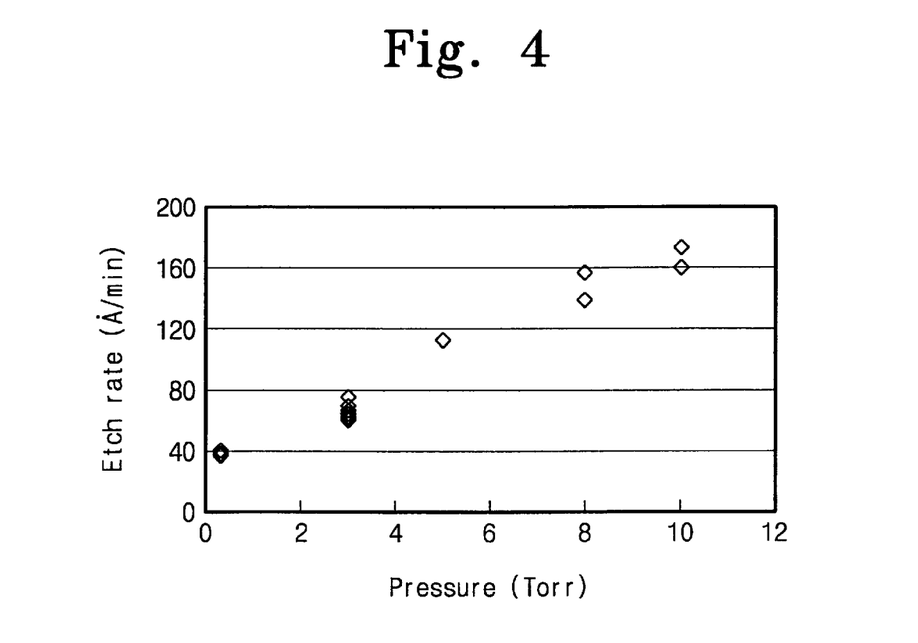
FIG. 4 is a graph illustrating the relationship between deposition pressure and etch rate in a nitride layer.

FIG. 4 is an experimental graph illustrating the relationship between a deposition pressure and etch rate in a nitride layer formed by a chemical vapor deposition (CVD) method. In the experiment, $SiH_2Cl_2$ gas and ammonia ($NH_3$) gas are injected by 30 sccm and 300 sccm, respectively, at a temperature of about 670° C. and under various pressures of 0.3, 3, 5, 8 and 10 Torr, to form silicon nitride layers. The silicon nitride layers are etched with a 15% phosphoric acid, and the etch rates are measured.

Referring to FIG. 4, the etch rate of an LPCVD nitride layer is proportional to the deposition pressure. In the case of the etch recipe using the phosphoric acid, the nitride layer formed under the deposition pressure of 10 Torr had an etch rate of 165 Å/min which is four times faster than the etch rate of 40 Å/min of the nitride layer formed under the deposition pressure of 0.3 Torr. Through these experimental results, it can be concluded that nitride layers having an etch selectivity can be obtained by controlling a deposition pressure during the process of forming a nitride layer.

Figure 5:
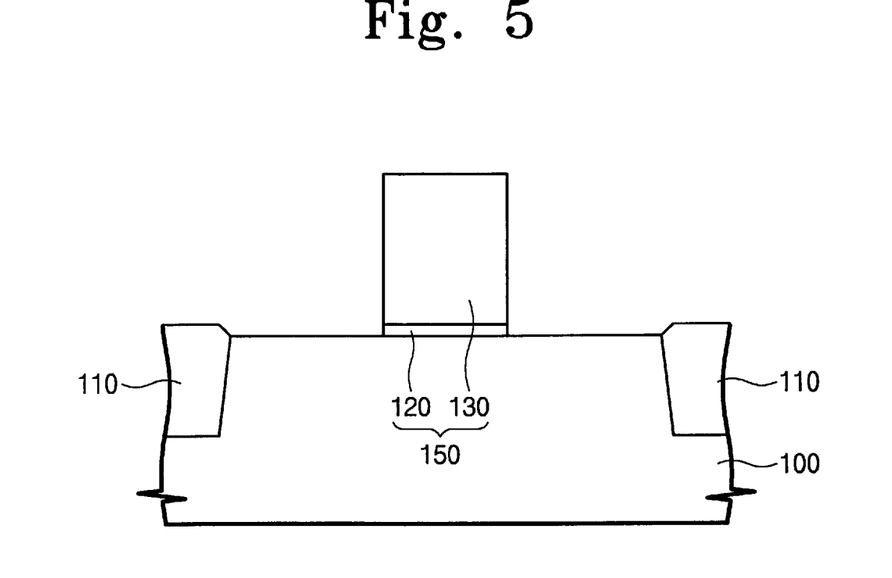
FIGS. 5 through 10 are cross-sectional views illustrating a method of forming a spacer according to a preferred embodiment of the present invention.

Referring to FIG. 5, an isolation pattern 110 is formed to define an active region in a predetermined region of a semiconductor substrate 100. The semiconductor substrate 100 is etched to form a trench and this trench is filled with a silicon oxide layer to form the isolation patterns 110. Also, before forming the isolation patterns 110, a thermal oxide layer and a liner are preferably additionally formed to cover the inner wall of the trench.

A gate oxide layer and a gate conductive layer are sequentially stacked over substantially the entire surface of the semiconductor substrate, including the isolation pattern 110. The gate conductive layer and the gate oxide layer then are sequentially patterned to form a gate pattern 150 composed of a gate conductive pattern 130 and a gate oxide pattern 120. The gate pattern 150 is formed by using an anisotropical etching method, and the gate oxide layer is preferably used as an etch stopping layer.

The gate conductive pattern 130 is preferably of a sequentially stacked polysilicon layer and silicide. In the case of a non-volatile memory device, the gate pattern 150 may further include a gate interlayer dielectric layer (not illustrated) interposed in the gate conductive pattern 130. Additionally, in order to minimize the effect of scattered reflection resulting from the gate conductive pattern 130 in a photolithography process for forming the gate pattern 150, a reflection preventive pattern (not illustrated) is preferably formed at the top of the gate conductive pattern 130. The reflection preventive pattern is preferably formed of a SiON layer and is removed after forming the gate pattern 150.

Figure 6:
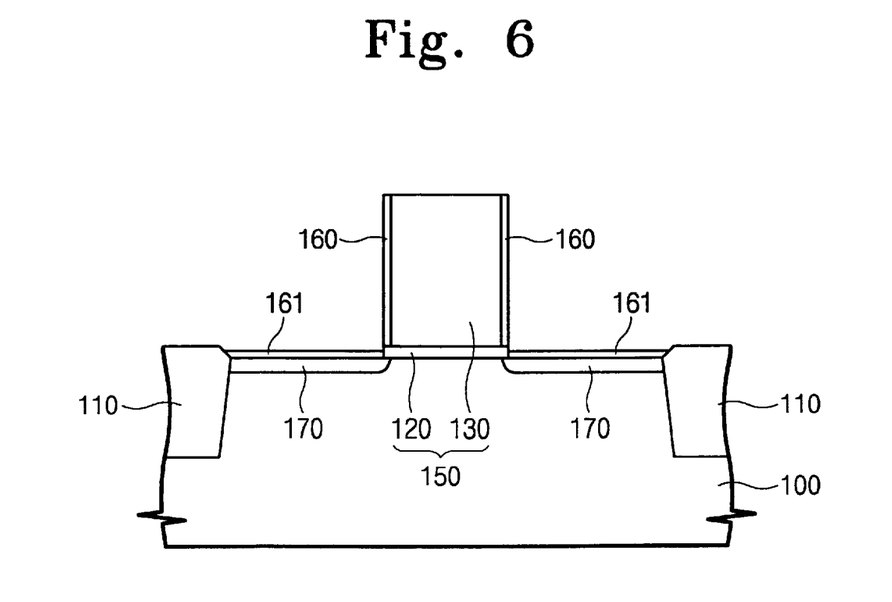

Referring to FIG. 6, a low concentration ion-implantation process is performed by using the gate pattern 150 as an ion-implantation mask, to form a low concentration impurity region 170 at a semiconductor substrate 100 adjacent to the gate pattern 150. Preferably, before performing the low concentration ion-implantation process, a gate oxidation process is performed. As a result, a gate sidewall oxide layer 160 and a buffer oxide layer 161 are formed at the sidewall of the gate conductive pattern 130 and the semiconductor substrate 100 adjacent to the gate pattern 150, respectively.

The gate oxidation process cures any etch damage generated during the anisotropical etching process for forming the gate pattern 150. Additionally, the buffer oxide layer 161 is used as a buffer layer preventing a crystalline defect of the semiconductor substrate and ion channeling in the low concentration ion-implantation process. An oxide layer formed naturally may be used as the buffer layer.

Figure 7:
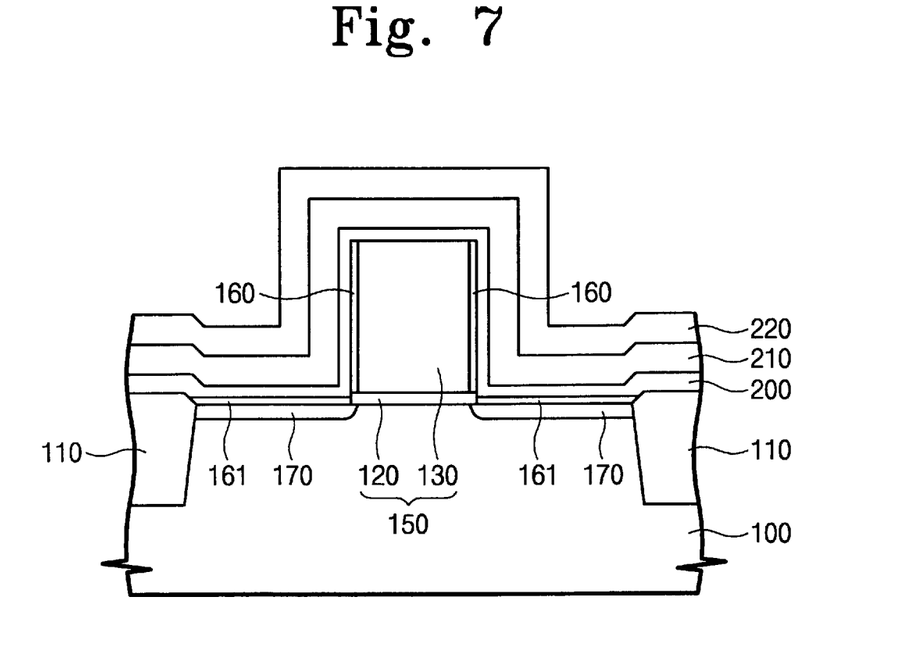

Referring to FIG. 7, a first, a second, and a third insulation layers 200, 210, and 220 are sequentially formed over substantially the entire surface of the semiconductor substrate, including the low concentration impurity region 170.

As explained above in connection with the conventional technology, when the second insulation layer 210 is thin, it is difficult to determine the endpoint in the process of etching the second insulation layer 210 anisotropically. In order to solve this problem, the second insulation layer 210 and the third insulation layer 220 are preferably formed of material layers of the same chemical composition. This is because the sum of the thicknesses of the two insulation layers 210 and 220 is enough to determine the endpoint in the anisotropical etching process, when the two insulation layers 220 and 210 have the same chemical composition. The second and third insulation layers 210 and 220 are preferably of a silicon nitride layer, which is formed at a temperature of 500 to 700° C. by using the LPCVD method.

In the present invention, the third insulation layer 220 has a faster etch rate than the second insulation layer 210, so that a spacer formed of the third insulation layer 220 is selectively removed in a subsequent process of removing the spacer. This is regarded as of major feature in the present invention. In order to make the difference in the etch rate, the second and third insulation layers 210 and 220 are formed under different deposition pressures based upon the experimental results illustrated in FIG. 4. Especially, in order that the third insulation layer 220 has a faster etch rate than the second insulation layer 210, the second insulation layer and the third insulation layer are preferably formed under the first pressure and the second pressure higher than the first pressure, respectively.

Referring to FIG. 4, if the second pressure is higher than the first pressure, the third insulation layer 220 has a faster etch rate than the second insulation layer 210. However, in order to have an effective etch selectivity, the first pressure is 0.01 to 1 Torr, and the second insulation layer is 3 to 100 Torr, respectively. At this time, the second insulation layer 210 and the third insulation layer 220 have an etch selectivity of about 4 with respect to an etchant including phosphoric acid.

The first insulation layer 200 acts as an etch stopping layer in an etching process for forming a spacer and as a buffer layer in an ion-implantation process for forming source/drain regions. Thus, the first insulation layer 200 is formed of a material having an etch selectivity with respect to the second insulation layer 210, and preferably of a silicon oxide layer formed by a CVD method. The first, second and third insulation layers 200, 210, and 220 preferably and conformally cover substantially the entire surface of the semiconductor substrate, including where the low concentration impurity region 170 is formed.

Figure 8:
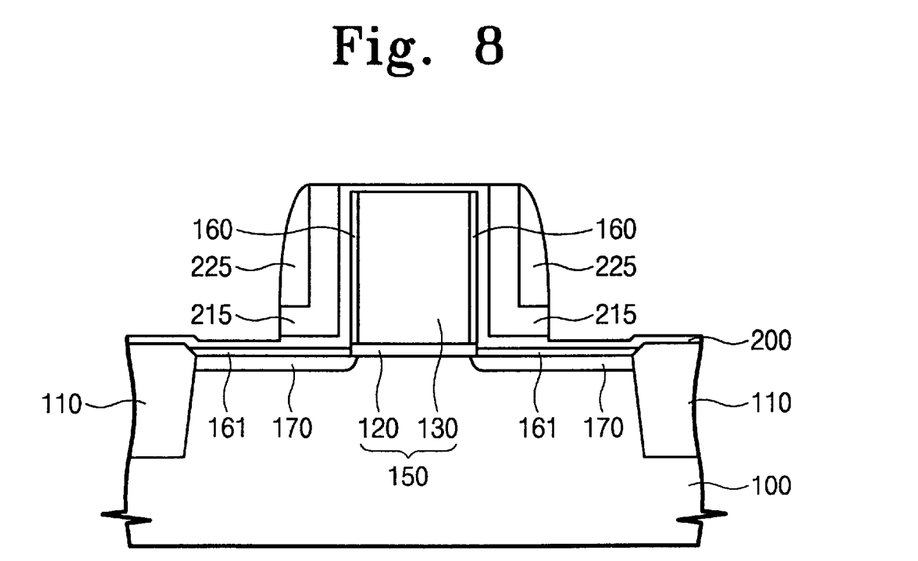

Referring to FIG. 8, the third insulation layer 220 and the second insulation layer 210 are sequentially etched to expose the first insulation layer 200.

As illustrated in FIG. 7, since the second and third insulation layers 210 and 220 are formed of material layers having the same chemical composition, the sum of the thicknesses of the two insulating layers 210 and 220 is enough to determine the endpoint in the anisotropical etching process. Therefore, the third and second insulation layers 220 and 210 are preferably, sequentially, and anisotropically etched. Thus, the third insulation layer 220 forms a spacer 225 at the sidewall of the gate pattern 150, and more particularly, at the sidewall of the second insulation layer 210. Additionally, the second insulation layer 210 forms a second insulation pattern 215 interposed between the spacer 225 and the first insulation layer 200 covering the gate pattern 150. The second insulation pattern 215 may seem to be L shaped, with a horizontally protruding part between a lower surface of the spacer 225 and an upper surface of the semiconductor substrate 100.

In the case that the second insulation layer 210 remains in an etching process for forming the spacer 225, the remnant second insulation layer acts as an etch stopping layer in an etching process of the first insulation layer 200 thereunder. In this case, the semiconductor substrate 100 at the side of the spacer 225 is not exposed, which may result in contact inferiority in a subsequent process of forming a contact. Thus, the etching process for forming the spacer 225 preferably entirely exposes the first insulation layer 200 at the side of the spacer 225 by an over-etch method. As a result, a part of the top surface of the exposed first insulation layer 200 may be recessed. But, in the case that the semiconductor substrate 100 below the first insulation layer 200 is exposed by the over etch, this may result in ion channeling and crystalline defect in a subsequent process of forming source/drain regions, as explained in the conventional technology. Thus, the etching process for forming the spacer 225 is preferably performed by using an etch recipe having an etch selectivity with respect to the first insulation layer 200.

Figure 9:
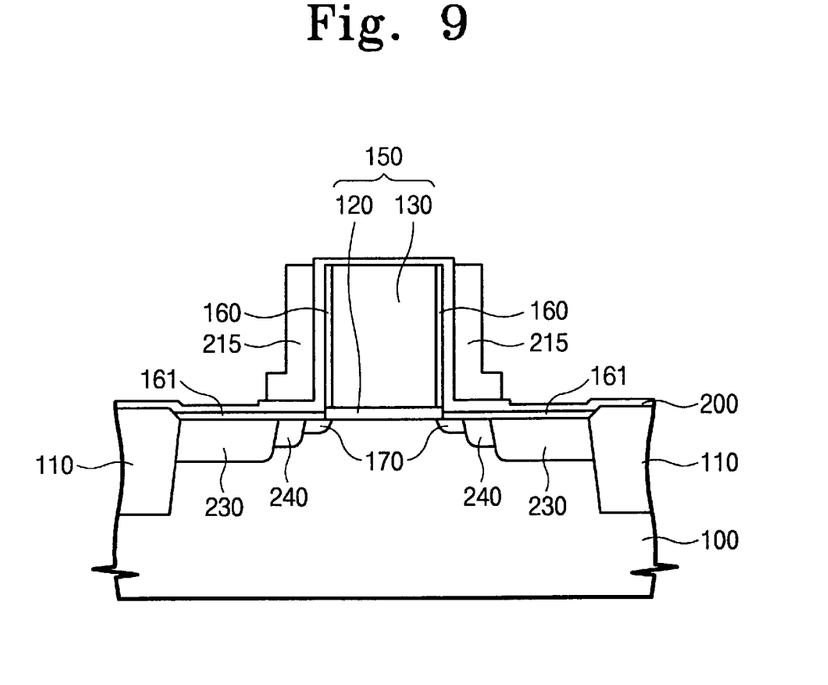

Referring to FIG. 9, the spacer 225 is removed to expose the surface of the second insulation pattern 215 which has been covered by the spacer 225. Then, a high concentration ion-implantation process is performed by using the gate pattern 150 and the second insulation pattern 215 as ion-implantation masks, to form source/drain regions 230 at the semiconductor substrate 100 beside the gate pattern 150.

The spacer 225 is preferably removed by an isotropic etching method. This is because an anisotropical etching method for removing the spacer 225 results in serious etch damage in the vicinity. Meanwhile, since the second insulation layer pattern 215 is formed of the same material as the spacer 225, the second insulation layer pattern 215 may be recessed during the etching process for removing the spacer 225. But, since the spacer 225 is formed under a higher deposition pressure than the deposition pressure of the second insulation layer 210, the spacer is etched at a faster rate than is the second insulation pattern 215. Thus, although the spacer 225 is entirely removed in the isotropic etching process, the second insulation pattern 215 is only partially etched.

Conventionally, the second insulation layer 60 is etched to form the second insulation pattern 65 by an isotropic over-etching process. As a result, the horizontally protruded part of the second insulation pattern 65 is over-etched not to have such a distinct L shape. However, in the present invention, the spacer 225 is removed by an isotropic etching process but not by the over-etch method. This is because the purpose of the over-etch in the conventional technology is to remove the second insulation layer 210 adjacent to the spacer 225. But, the over-etch for this purpose has been already performed during the anisotropical etching process for forming the spacer 225. Thus, in the present invention, the second insulation pattern 215 forms a distinctly L-shaped spacer.

Also, conventionally, when the spacer 75 is removed in the etching process, the first insulation layer 50 composed of the same material as the spacer 75 is also etched to expose the semiconductor substrate 10. Thus, the high concentration ion-implantation process is performed such that the first insulation layer 50 for the buffer layer is removed. However, in the present invention, the spacer 225 is removed during the etching process by using an etch recipe having an etch selectivity with respect to the first insulation layer 200. Thus, the first insulation layer 200 still covers the top surface of the semiconductor substrate 100 where the source/drain regions 230 will be formed. It is the first insulation layer 200 that prevents the crystalline defect and ion channeling in the high concentration ion-implantation process. As noted, the etch recipe for removing the spacer 225 preferably uses an etchant including phosphoric acid.

Likewise with a transistor having a conventional L-shaped spacer, the high concentration ion-implantation process forms an intermediate concentration impurity region 240 at the bottom of the horizontally protruded part of the second insulation pattern 215. The depth of the middle concentration impurity region 240 is reduced by the thickness of the horizontally protruded part of the second insulation pattern 215. As a result, the middle concentration impurity region 240 is interposed between the source/drain regions 230 and the low concentration impurity region 170, thereby decreasing the electrical resistance between the source region and the drain region. After forming the source/drain regions 230 and the intermediate concentration impurity region 240, a thermal treatment process is preferably additionally performed at a temperature of 600 to 1,000° C. for activation of the implanted impurities.

The etching process for removing the spacer 225 recesses the horizontally protruded part of the second insulation pattern 215 according to an etch selectivity with respect to the spacer 225, although the recessed quantity is small. This may result in the short-channel effect caused by the source/drain regions 230 becoming close to each other. In order to prevent this, the third insulation layer 220 is preferably thick by the extent that the horizontally protruded part of the second insulation layer 215 is recessed. This is because the thickness of the third insulation layer 220 determines the width of the spacer 225 and the length of the horizontally protruded part of the second insulation pattern 215.

Figure 10:
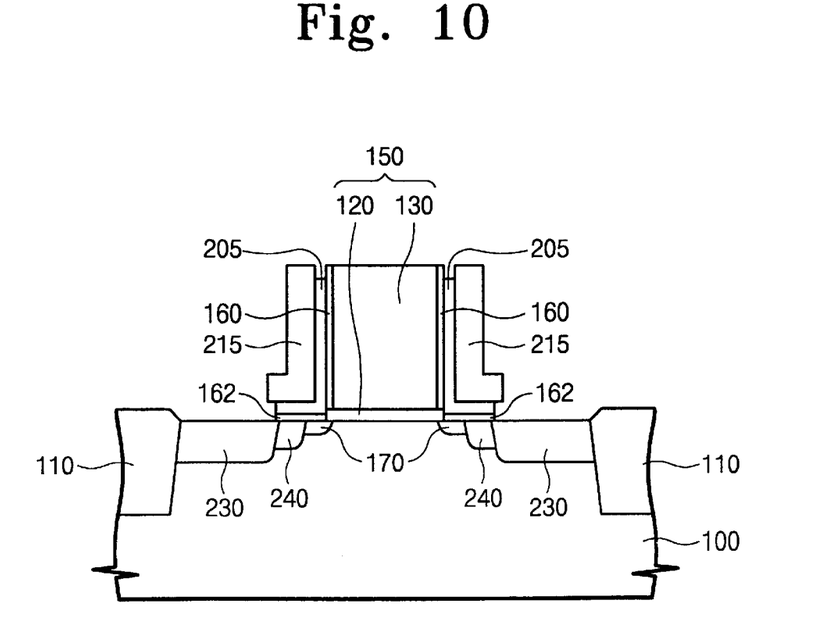

Referring to FIG. 10, the first insulation layer 200 and the buffer oxide layer 161 are etched until the source/drain regions 230 are exposed, thereby forming a first insulation pattern 205 and a buffer oxide pattern 162.

The etching process for forming the first insulation pattern 205 is preferably performed by an oxide etch recipe having an etch selectivity with respect to silicon and silicon nitride. Also, the etching process is performed by using the second insulation pattern 215 as an etch mask, and preferably by an isotropic etching method. Thus, an undercut region is formed at the bottom of the second insulation pattern 215, and the first insulation pattern 205 forms a recessed region between the second insulation pattern 215 and the gate pattern 150. Alternatively, and within the spirit and scope of the invention, the etching process may be performed by an anisotropical etching method.

According to the present invention, a general spacer and an L-shaped spacer are formed of materials having an etch selectivity with respect to each other and having the same chemical composition. Thus, an etching process of removing the spacer can minimize the extent that the horizontally protruded part of the L-shaped spacer is recessed, thereby preventing the short-channel effect.

Also, according to the present invention, source/drain regions are formed at a semiconductor substrate covered by a buffer layer, thereby preventing a crystalline defect and ion channeling at the semiconductor substrate.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of forming a spacer in a semiconductor device, comprising:

forming a gate pattern on a semiconductor substrate;

forming a first insulation layer over substantially an entire surface of the semiconductor substrate where the gate pattern is formed;

forming a second insulation layer on the first insulation layer under a first pressure;

forming a third insulation layer on the second insulation layer under a second pressure higher than the first pressure;

sequentially anisotropically etching the third and second insulation layers to form a spacer and a second insulation pattern, and to expose the first insulation layer;

removing the spacer by using an etch recipe having an etch selectivity with respect to the second insulation pattern, to expose the second insulation pattern; and etching the first insulation layer until the semiconductor substrate is exposed, to form a first insulation pattern.

2. The method as claimed in claim 1, wherein the first insulation layer is formed of a silicon oxide layer.

3. The method as claimed in claim 1, wherein the second insulation layer and the third insulation layer are formed of the same material.

4. The method as claimed in claim 1, wherein the second insulation layer and the third insulation layer are formed of a silicon nitride layer.

5. The method as claimed in claim 1, wherein the second insulation layer and the third insulation layer are formed by using a low pressure chemical vapor deposition (LPCVD) technique.

6. The method as claimed in claim 1, wherein the second insulation layer and the third insulation layer are formed at a temperature of between approximately 500 and 700° C.

7. The method as claimed in claim 1, wherein the first pressure is between proximately 0.01 and 1 Torr.

8. The method as claimed in claim 1, wherein the second pressure is between approximately 3 and 100 Torr.

9. The method as claimed in claim 1, wherein the first, second and third insulation layers are formed into conformal thicknesses.

10. The method as claimed in claim 1, after forming the gate pattern, further comprising:

oxidizing the exposed surface of the gate pattern and the semiconductor substrate.

11. The method as claimed in claim 10, after the gate oxidation process, further comprising:

forming a low concentration impurity region at the semiconductor substrate by performing a low concentration ion-implantation process using the gate pattern as an ion-implantation mask.

12. The method as claimed in claim 1, wherein the anisotropical etching of the third insulation layer and the second insulation layer is performed by using an etch recipe having an etch selectivity with respect to the first insulation layer.

13. The method as claimed in claim 1, wherein the removing of the spacer is performed by an isotropic etching method.

14. The method as claimed in claim 1, wherein the removing of the spacer is performed by an etch recipe having an etch selectivity with respect to the first insulation layer.

15. The method as claimed in claim 1, wherein the removing of the spacer uses an etchant including a phosphoric acid.

16. The method as claimed in claim 1, after removing the spacer, further comprising:

forming source/drain regions at the semiconductor substrate by performing a high concentration impurity-implantation process by using the second insulation pattern, the first insulation pattern and the gate pattern as ion-implantation masks.

17. The method as claimed in claim 1, before forming the gate pattern, further comprising:

forming an isolation pattern to define an active region at a predetermined region of the semiconductor substrate.

* * * * *